United States Patent
Freuler et al.

(10) Patent No.: US 6,483,707 B1
(45) Date of Patent: Nov. 19, 2002

(54) HEAT SINK AND THERMAL INTERFACE HAVING SHIELDING TO ATTENUATE ELECTROMAGNETIC INTERFERENCE

(75) Inventors: Raymond G. Freuler, Laguna Hiills, CA (US); Gary E. Flynn, Coto de Caza, CA (US)

(73) Assignee: Loctite Corporation, Rock Hill, CT (US)

( * ) Notice: Subject to any disclaimer, the term of this patent is extended or adjusted under 35 U.S.C. 154(b) by 0 days.

(21) Appl. No.: 09/876,573

(22) Filed: Jun. 7, 2001

(51) Int. Cl.⁷ ................................................. H05K 7/20
(52) U.S. Cl. ...................... 361/713; 156/346; 165/80.3; 174/252; 361/703; 428/209; 428/343
(58) Field of Search ............................... 156/60, 89.23, 156/89.24, 272.2, 325, 346; 428/40.1, 40.4, 209, 320.2, 322, 343, 344; 174/16.3, 252; 165/185, 80.3, 80.4; 257/692, 713, 714, 718, 719, 722, 727, 728; 361/700, 703, 704, 705, 709–712, 717–719

(56) References Cited

U.S. PATENT DOCUMENTS

| | | |
|---|---|---|
| 2,799,793 A | 7/1957 | Do Cain |
| 2,887,628 A | 5/1959 | Zierdt, Jr. |
| 3,013,104 A | 12/1961 | Young |
| 3,249,680 A | 5/1966 | Sheets et al. |
| 3,356,828 A | 12/1967 | Furness |
| 3,391,242 A | 7/1968 | Sudges |
| 3,463,140 A | 8/1969 | Rollor, Jr. |
| 3,463,161 A | 8/1969 | Andrassy |
| 3,467,547 A | 9/1969 | Harvey et al. |
| 3,476,177 A | 11/1969 | Potzl |
| 3,586,102 A | 6/1971 | Gilles |
| 3,603,106 A | 9/1971 | Ryan |
| 3,819,530 A | 6/1974 | Ratledge et al. |
| 3,823,089 A | 7/1974 | Ryan et al. |

(List continued on next page.)

FOREIGN PATENT DOCUMENTS

| | | |
|---|---|---|
| CA | 600823 | 6/1960 |
| FR | 2368529 | 10/1976 |
| GB | 1086003 | 10/1967 |

OTHER PUBLICATIONS

Power Devices, Inc.: "Kapton MT Substrate Coated with High Performance Thermal Compund in Easy–to–Use Form"; MCM–Strate; 1996.

Power Devices, Inc.; "Low Thermal Resistance and Excellent Electrical Insulation in One Clean, Reliable System"; Isostrate.

Power Devices, Inc.; Adhesive–Backed Aluminum Substrate with High Performance Thermal Compound in Easy–to–Use Form; MCM–Strate: 1996.

Power Devices, Inc.; The Cost–Effective Solution to Thermal Interface Problems–Clean, Dry and Easy to Use; Thermstrate.

Chomerics; "Thermattach 404 and 405 Thermally Conductive Adhesive Tapes"; Cho–Therm Thermal Interface Materials; Technical Bulletin 72; 1993.

(List continued on next page.)

*Primary Examiner*—Gerald Tolin
(74) *Attorney, Agent, or Firm*—Stetina Brunda Garred & Brucker

(57) ABSTRACT

Heat sink and electrically non-conducting thermal interface having shielding to attenuate electromagnetic interference. The interface comprises a generally planar substrate having first and second outwardly facing surfaces. The substrate is formed from a material, preferably a polymer, that is both thermally conductive and has a high dielectric strength. Formed upon the outwardly facing surfaces are layers of a thermally conductive compound for facilitating heat transfer. The invention further comprises an improved heat sink comprising a baseplate coupled with a folded-fin assembly, the latter being compressively bonded thereto via a pressure clip and pressure spreader assembly. The base plate is attachable to a heat-dissipating component, and may optionally include a ground contact connection for use with components that are not already grounded.

14 Claims, 2 Drawing Sheets

U.S. PATENT DOCUMENTS

| | | |
|---|---|---|
| 3,887,628 A | 6/1975 | Beckers |
| 3,972,821 A | 8/1976 | Weidenbenner et al. |
| 4,065,908 A | 1/1978 | Mueller |
| 4,139,051 A | 2/1979 | Jones et al. |
| 4,151,547 A | 4/1979 | Rhoades et al. |
| 4,237,086 A | 12/1980 | Gehle |
| 4,266,267 A | 5/1981 | Ruegg |
| 4,299,715 A | 11/1981 | Whitfield et al. |
| 4,466,483 A | 8/1984 | Whitfield et al. |
| 4,473,113 A | 9/1984 | Whitfield et al. |
| 4,489,487 A | 12/1984 | Bura |
| 5,060,114 A | 10/1991 | Feinberg et al. |
| 5,237,086 A | 8/1993 | Kruger et al. |
| 5,912,805 A | 6/1999 | Freuker et al. |
| 5,930,893 A * | 8/1999 | Eaton .................... 29/890.03 |
| 5,931,831 A | 8/1999 | Linder |
| 5,986,884 A | 11/1999 | Jairazbhoy et al. |
| 6,054,198 A * | 4/2000 | Bunyan et al. |
| 6,165,612 A * | 12/2000 | Misra .......................... 428/344 |
| 6,260,610 B1 * | 7/2001 | Biber et al. ................ 165/80.3 |
| 6,343,013 B1 * | 1/2002 | Chen .......................... 361/695 |
| 6,357,514 B1 * | 3/2002 | Sasaki et al. .............. 165/80.3 |

OTHER PUBLICATIONS

Chomerics; "Thermattach T413 and T414 Thermally Conductive Adhesive Tapes"; Preliminary Product Data Sheet; 1994.

Chomerics; "Thermattach T705 and T710 Low Thermal Resistance Interface Pads"; Cho–Therm Thermal Interface Material; Technical Bulletin 77; 1997.

The Bergquist Company; "Sil–Pad Design Guide"; Spring 1993.

* cited by examiner

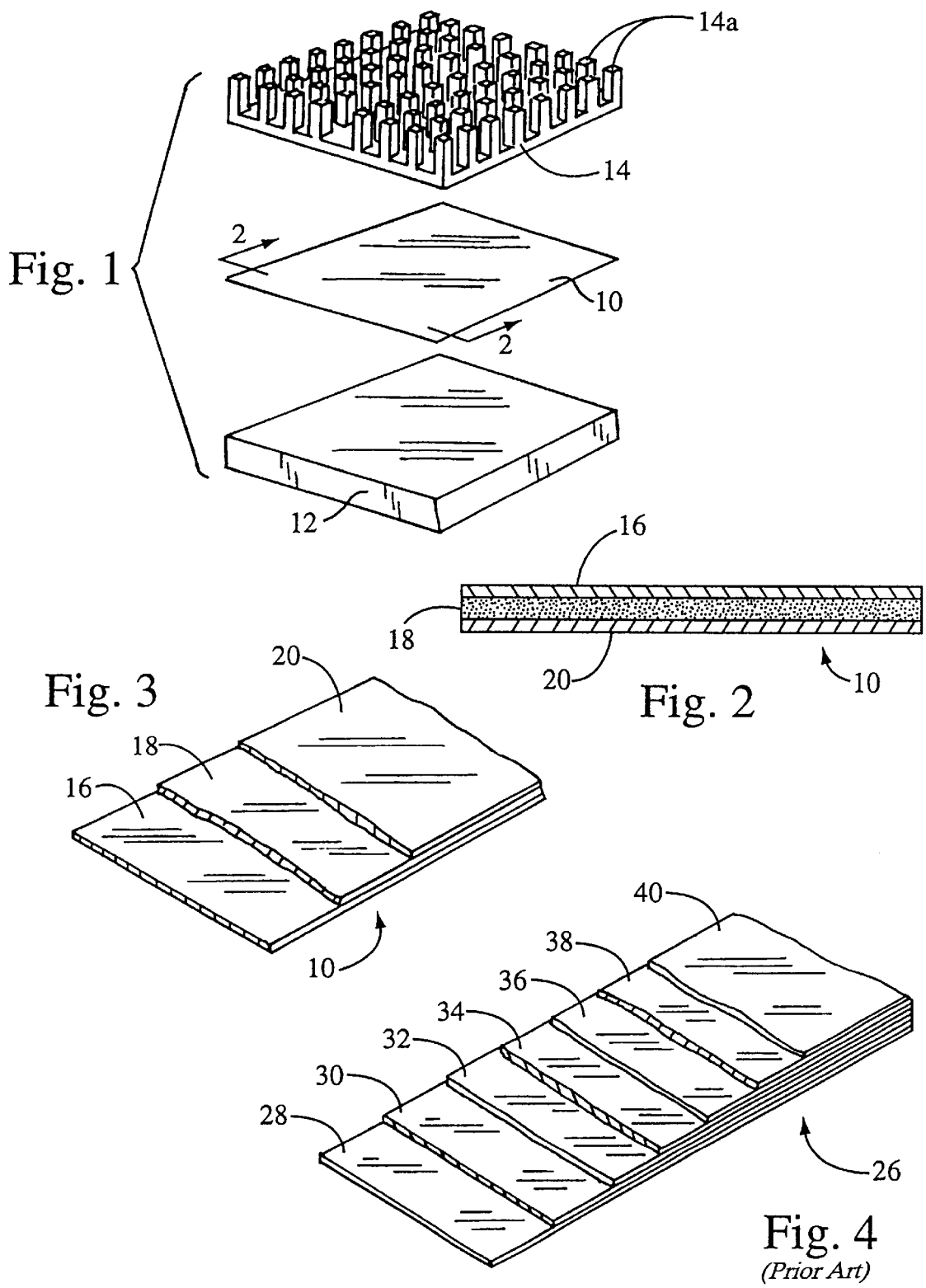

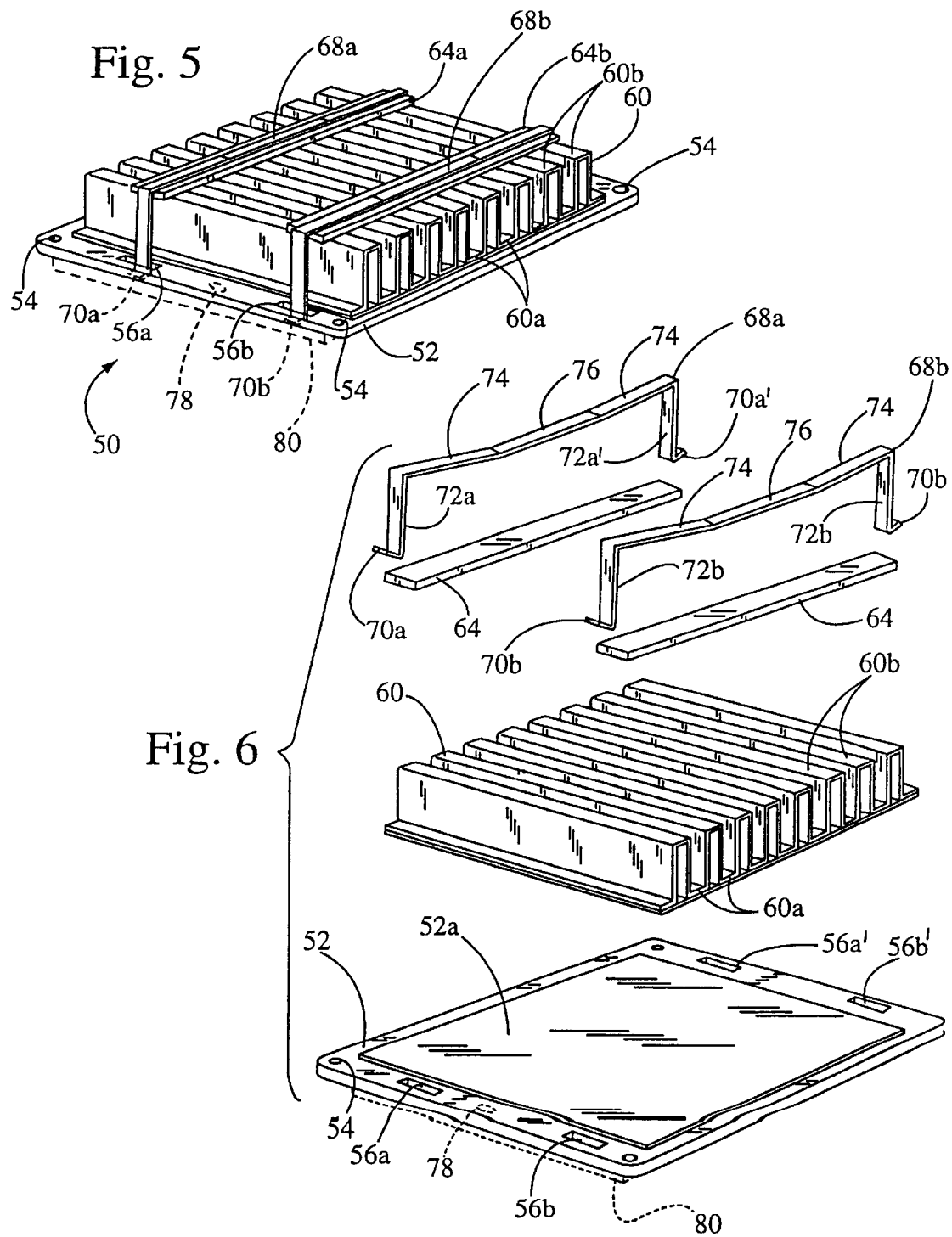

HEAT SINK AND THERMAL INTERFACE HAVING SHIELDING TO ATTENUATE ELECTROMAGNETIC INTERFERENCE

BACKGROUND OF THE INVENTION

Interface systems for use in transferring heat produced from a heat-dissipating electronic component to a heat dissipator or heat sink are well-known in the art. In this regard, such electronic components, the most common being computer chip microprocessors, generate sufficient heat to adversely affect their operation unless adequate heat dissipation is provided. To achieve this end, such interface systems are specifically designed to aid in the transfer of heat by forming a heat-conductive pathway from the component to its mounting surface, across the interface, and to the heat sink.

In addition to facilitating the transfer of heat, certain applications further require electrical insulation. Accordingly, such interface systems are frequently further provided with materials that are not only effective in conducting heat, but additionally offer high electrical insulating capability. Among the materials frequently utilized to provide such electrical insulation are polyimide substrates, and in particular KAPTON (a registered trademark of DuPont) type MT.

Exemplary of such contemporary thermal interfaces are THERMSTRATE and ISOSTRATE (both trademarks of Power Devices, Inc. of Laguna Hills, Calif.). The THERMSTRATE interface comprises thermally conductive, die-cut pads which are placed intermediate the electronic component and the heat sink so as to enhance heat conduction therebetween. The THERMSTRATE heat pads comprise a durable-type 1100 or 1145 aluminum alloy substrate having a thickness of approximately 0.002 inch (although other aluminum and/or copper foil thickness may be utilized) that is coated on both sides thereof with a proprietary thermal compound, the latter comprising a paraffin base containing additives which enhance thermal conductivity, as well as control its responsiveness to heat and pressure. Such compound advantageously undergoes a selective phase-change insofar the compound is dry at room temperature, yet liquifies below the operating temperature of the great majority of electronic components, which is typically around 51E° C. or higher, so as to assure desired heat conduction. When the electronic component is no longer in use (i.e., is no longer dissipating heat), such thermal conductive compound resolidifies once the same cools to below 51E° C.

The ISOSTRATE thermal interface is likewise a die-cut mounting pad that utilizes a heat conducting polyimide substrate, namely, KAPTON (a registered trademark of DuPont) type MT, that further incorporates the use of a proprietary paraffin based thermal compound utilizing additives to enhance thermal conductivity and to control its response to heat and pressure. Advantageously, by utilizing a polyimide substrate, such interface is further provided with high dielectric capability.

Additionally exemplary of prior-art thermal interfaces include those disclosed in U.S. Pat. No. 5,912,805, issued on Jun. 15, 1999 to Freuler et al. and entitled THERMAL INTERFACE WITH ADHESIVE. Such patent discloses a thermal interface positionable between an electronic component and heat sink comprised of first and second generally planar substrates that are compressively bonded to one another and have a thermally-conductive material formed on the outwardly-facing opposed sides thereof. Such interface has the advantage of being adhesively bonded into position between an electronic component and heat sink such that the adhesive formed upon the thermal interface extends beyond the juncture where the interfaces interpose between the heat sink and the electronic component.

The process for forming thermal interfaces according to contemporary methodology is described in more detail in U.S. Pat. No. 4,299,715, issued on Nov. 10, 1981 to Whitfield et al. and entitled METHODS AND MATERIALS FOR CONDUCTING HEAT FROM ELECTRONIC COMPONENTS AND THE LIKE; U.S. Pat. No. 4,466,483, issued on Aug. 21, 1984 to Whitfield et al. and entitled METHODS AND MEANS FOR CONDUCTING HEAT FROM ELECTRONIC COMPONENTS AND THE LIKE; and U.S. Pat. No. 4,473,113, issued on Sep. 25, 1984 to Whitfield et al. and entitled METHODS AND MATERIALS FOR CONDUCTING HEAT FROM ELECTRONIC COMPONENTS AND THE LIKE, the contents of all three of which are expressly incorporated herein by reference.

In addition to the construction of thermal interfaces, there have further been advancements in the art with respect to the thermal compositions utilized for facilitating the transfer of heat across an interface. Exemplary of such compounds include those disclosed in U.S. Pat. No. 6,054,198, issued on Apr. 25, 2000 to Bunyan et al. and entitled CONFORMAL THERMAL INTERFACE MATERIAL FOR ELECTRONIC COMPONENTS, and U.S. Pat. No. 5,930,893, issued on Aug. 3, 1999 to Eaton and entitled THERMALLY CONDUCTIVE MATERIAL AND METHOD OF USING THE SAME, the teachings of which are expressly incorporated by reference.

In addition to being able to facilitate the transfer of heat and provide electrical insulation, many interface systems additionally employ a grounded substrate formed from a conductive material, such as copper, to suppress radiated emissions, namely electromagnetic interference (EMI), generated in high frequency transistor applications. In this regard, such grounded substrate is utilized to minimize capacitance to the heat sink to which it is attached, as well as to provide shielding effectiveness and attenuation of radiated EMI. With respect to the latter, it has been shown that electrically grounded copper substrates can provide shielding effectiveness to 60 dB at 1000 KHz, which is an attenuation percentage of 99.9%.

One such commercially-available thermal interface incorporating a grounded conductive substrate is EMI-STRATE (a registered trademark of Power Devices, Inc. of Laguna Hills, Calif.). Such interface comprises a grounded copper substrate sandwiched between two polyimide film substrates, the latter being comprised of KAPTON-type MT. The exterior sides of such interface are further coated with a proprietary thermal compound to thus facilitate the transfer of heat away from the electronic component to a heat sink.

Notwithstanding the effectiveness of thermal interfaces currently in use, a substantial need exists in the art for an interface that provides greater EMI attenuation, shielding effectiveness, and thermal conductivity. In this regard, newer electronic componentry continues to have ever increasing power dissipation and EMI emission. While such electronic componentry typically is constructed and/or packaged to be electrically isolated, the aforementioned increases in power dissipation and EMI emission currently present drawbacks that must be addressed if such componentry is to perform optimally. Additionally, as such advances are made in such componentry, it is certain that the aforementioned concerns regarding radiated emission and power dissipation will continue to create a demand for an interface system that can adequately address the same.

Prior art interface systems, however, are ill-suited to meet such needs insofar as such interface systems, because of their multiple-layer construction, substantially reduces the flow of heat thereacross. In this regard, it has been found that the use of thermal interface systems having six layer construction does not provide desirable heat transfer from a given electronic component to a heat sink. Moreover, not only does each individual layer impede heat flow, but, as those skilled in the art will appreciate, each interface of adjacent layers additionally inhibits heat flow. In this respect, each layer contributes three distinct impediments to heat flow, namely, each layer introduces the material of which the layer itself is comprised, as well as the two interfaces at either surface of the layer. Thus, it will be appreciated that it is highly desirable to minimize the number of layers, and consequently the number of interfaces, comprising such interface system. In addition to the foregoing, it should be noted from a practical standpoint that manufacturing such interface systems having multiple layers is expensive.

In addition to the need for improved interface systems is the need for improved heat sinks to be used therewith that are capable of more effectively and efficiently dissipating the heat transfer thereto. In this regard, most heat sinks in use, which are typically fabricated from extruded aluminum, are formed to have a base with a plurality of fins extending therefrom. The fins are equidistantly spaced from one another and are formed to have sufficient surface area to dissipate the heat into the surrounding air. In this respect, a fan is frequently used to assure adequate circulation of air over the fins, so as to maintain desirable heat dissipation therefrom.

Unfortunately, however, the number of fins and the spacing therebetween is limited by the aluminum extrusion process. As is well-known, fins spaced closer together than 0.2 inches tends to block natural convection air flow and cannot be optimized for use in forced convection. Additionally, conventional extrusion technology limits the amount of surface area, namely, the height of the fins of the heat sink, which further constrains heat removal. In this respect, it is well-known that the amount of surface area is proportional to the amount of heat that can be removed. Hence, a decrease in surface area thus translates into limited heat removal.

To partially address the aforementioned inadequacies with extruded aluminum heat sinks has been the introduction of folded-fin heat sinks. Such assemblies comprise a relatively thin base section and a set of fins folded into corrugated sections mounted thereon. The base section is typically formed to be either very thin to reduce mass or, alternatively, thicker to act as a heat spreader. The folded fins coupled to the base act as a heat-transfer area, allowing a stream of forced air to remove heat from the base. Currently, such folded-fin heat sinks offer the maximum potential in surface area and reduced weight. In this respect, thermal resistance as low as $0.40E°$ C./W can be reached with folded-fin assemblies in forced-air cooling at 500 ft/min of air velocity. Moreover, in utilizing a corrugated piece of aluminum or copper, there is thus eliminated the restrictions otherwise faced in the extrusion process.

Notwithstanding the desirability of such folded-fin heat sinks, the same still suffer from the drawback of failing to achieve optimal heat transfer and dissipation insofar as current folded-fin heat sinks fail to achieve optimal heat transfer from the base to the folded-fin assembly coupled thereto. As such, the maximum amount of heat that could otherwise be dissipated by the assembly is not attained.

Accordingly, there is a need in the art for a thermal interface that provides greater thermal conductivity and greater electrical insulation than prior art interfaces. There is additionally a need in the art for such a thermal interface that is of low cost, easy to manufacture, and may be readily utilized with existing componentry requiring the integration of a thermal interface system. Moreover, there is a need in the art for an improved heat sink that is more effective and efficient at dissipating heat transferred thereto from an electronic component. There is further a need for such an improved heat sink that is particularly more effective in transferring heat from a given heat source to the fins or other apparatus by which the same is dissipated.

BRIEF SUMMARY OF THE INVENTION

The present invention specifically addresses and alleviates the aforementioned deficiencies in the art. Specifically, the present invention is directed to an interface system for use with electronic componentry that has superior electrical insulation and thermal conductivity properties than prior art systems. In the preferred embodiment, the interface system of the present invention comprises the combination of a generally planar substrate, preferably being comprised of a non-conductive material having a high dielectric strength. The planar substrate defines two outwardly facing flatwise surfaces that are configured to mate with the interface surfaces formed on the electronic component and the interface surface formed on the heat dissipator or heat sink, on the other surface Each respective outwardly facing surface has formed thereon a layer of a thermally conductive compound having a high degree of thermal conductivity to thus further facilitate the transfer of heat. In a preferred embodiment, such compound is preferably formed to have selective phase-change properties whereby the composition exists in a solid phase at normal room temperature, but melts, and therefore assumes a liquid phase, when subjected to the elevated temperatures at which the electronic component usually operates.

The present invention further includes an improved heat sink that is more efficient and effective in dissipating heat transferred thereto via an electronic component. Specifically, such improved heat sink comprises the combination of a base plate attachable to a heat-dissipating component and a folded-fin assembly compressively attached thereto. In a preferred embodiment, the heat sink is provided with one or more pressure clips (or other fastener arrangement) detachably fastenable to the baseplate that apply a compressive force, via a pressure spreader engagable therewith, against the folded-fin assembly that causes the assembly to remain compressively bonded with the baseplate from which the heat to be dissipated is received. To further facilitate the transfer of heat from the baseplate to the folded-fin assembly, there is preferably provided upon the baseplate a layer of a thermally-conductive compound having selective phase-change properties (i.e., liquefies during the operational temperature of the electronic component coupled to the heat sink), to eliminate any air gaps or voids between the baseplate and folded-fin assembly that would otherwise impede the transfer of heat. Alternatively, to the extent a greater degree of electrical isolation is desired, a thermal interface having a high dielectric capability may be interposed between the baseplate and folded-fin assembly.

The present invention thus provides a thermal interface system that provides both electrical insulation and sufficient thermal conductivity to effectively facilitate the removal of heat therefrom more so than prior art interface systems.

The present invention further provides a thermal interface having electrical isolation capability that utilizes a minimal number of layers in the construction thereof.

Another object of the present invention is to provide a thermal interface that is relatively simple and inexpensive to manufacture compared to prior art interface systems, and may be readily and easily utilized in a wide variety of commercial applications.

Another object of the present invention is to provide an improved heat sink that is more effective and efficient at dissipating heat transferred thereto from an electronic component, and especially more so than conventional heat sinks formed from extruded aluminum.

Another object of the present invention is to provide an improved heat sink that is capable of more effectively transferring heat received thereby to the heat-dissipating component thereof than prior art heat sinks.

A still further object of the present invention is to provide an improved heat sink that is of simple construction, may be readily and easily fabricated from existing materials well-known to those skilled in the art, is relatively inexpensive, and may be readily and easily utilized in numerous commercial applications.

BRIEF DESCRIPTION OF THE DRAWINGS

These as well as other features the present invention will become more apparent upon reference to the drawings wherein:

FIG. 1 is an exploded perspective view of an extruded heat sink positioned for attachment to an electronic component showing a preformed thermal interface pad of the present invention being disposed therebetween;

FIG. 2 is a cross-sectional view taken along line 2?2 of FIG. 1;

FIG. 3 is a perspective view of the respective layers comprising the thermal interface of the present invention;

FIG. 4 is a perspective view of the respective layers comprising a prior art thermal interface;

FIG. 5 is a perspective view of an improved heat sink constructed in accordance to a preferred embodiment of the present invention; and FIG. 6 is an exploded perspective view of the heat sink depicted in FIG. 5.

DETAILED DESCRIPTION OF THE INVENTION

The detailed description set forth below in connection with the appended drawings is intended merely as a description of the presently preferred embodiment of the invention, and is not intended to represent the only form in which the present invention may be constructed or utilized. The description sets forth the functions and sequence of steps for construction and implementation of the invention in connection with the illustrated embodiments. It is to be understood, however, that the same or equivalent functions and sequences may be accomplished by different embodiments that are also intended to be encompassed within the spirit and scope of the invention.

Referring now to the drawings, and initially to FIG. 1, there is shown a thermal interface 10 constructed in accordance with one embodiment of the present invention. The thermal interface 10 is specifically designed and configured to facilitate the transfer of heat away from an electronic component 12 to a heat sink 14. In addition to facilitating the transfer of heat, the thermal interface 10 of the present invention is further provided with electrical insulating capability to thus substantially electrically isolate the electronic component 12 during the operation thereof.

As illustrated, the thermal interface 10 is specifically designed and adapted to be interposed between the electronic component 12 and heat sink 14. As is well-known, such heat sink 14 is provided with structures 0such as fins or other protuberances 14a having sufficient surface area to dissipate the heat into the surrounding air. Although not shown, to facilitate such heat dissipation, a fan is frequently utilized to provide adequate air circulation over the fins or protuberances 14a.

Preferably, the thermal interface 10 is die-cut or preformed to have a shape or footprint compatible with the particular electronic component and/or heat sink to thus enable the thermal interface 10 to maximize surface area contact at the juncture between the electronic component 12 and heat sink 14. Alternatively, the thermal interface 10 of the present invention may also be manually cut from a sheet of interface material, similar to other interface pads currently in use, so as to provide a custom fit between a given electronic component and heat sink.

Referring now to FIG. 2, there is shown a cross-sectional view of the thermal interface 10 of the present invention. As illustrated, the thermal interface 10 is comprised of three layers 16–20. The first layer 16 comprises a thermally conductive compound formulated to facilitate and enhance the ability of the interface 10 to transfer heat away from the electronic component to the heat sink. Similar to other prior art compositions, such layer 16 is preferably formulated to have certain desired phase-change properties. Specifically, at room temperature, i.e., when the electronic device is not operating, the layer of thermal compound 16 remains substantially solid.

Referring now to FIG. 2, there is shown a cross-sectional view of the thermal interface 10 of the present invention. As illustrated, the thermal interface 10 is comprised of three layers 16–20. The first layer 16 comprises a thermally conductive compound formulated to facilitate and enhance the ability of the interface 10 to transfer heat away from the electronic component to the heat sink. Similar to other prior art compositions, such layer 16 is preferably formulated to have certain desired phase-change properties. Specifically, at room temperature, i.e., when the electronic device is not operating, the layer of thermal compound 16 remains substantially solid. The thermally conductive composition may take any of those disclosed in Applicant's copending patent application entitled PHASE CHANGE THERMAL INTERFACE COMPOSITION HAVING INDUCED BONDING PROPERTY, filed on Apr. 12, 2001, and assigned application Ser. No. 09/834,158, and Applicant's co-pending patent application entitled GRAPHITIC ALLOTROPE INTERFACE COMPOSITION AND METHOD OF FABRICATING THE SAME, filed on May 18, 2000, and assigned application Ser. No. 09/573,508, the teachings of which are expressly incorporated herein by reference. Such thermal compounds have the desirable phase-change properties of assuming a solid phase at normal room temperature, but liquify at elevated temperatures of approximately 51° C. or higher, which is typically just below the operating temperatures at which most electronic components are intended to operate. It should be understood, however, that a wide variety of alternative thermally conductive materials and compounds are available and readily known to those skilled in the art which could be deployed for use in the practice of the present invention.

The second layer 18 is a generally planar substrate layer provided with an outwardly facing side and an inwardly facing side, the latter being bonded to the thermal component layer 16. Preferably, the substrate 18 is formed from a material that is both thermally conductive and has high dielectric strength. In a preferred embodiment, a substrate is fabricated from a polymer and preferably a polyimide. Not by way of limitation, one such highly preferred polyimide substrate includes KAPTON-type MT. However, other similar materials well-known to those skilled in the art may also be utilized, including ULTEM, a registered trademark of General Electric Corporation.

Advantageously, by using a substrate formed of a material having a high dielectric strength, there is thus provided a high degree of electrical insulation. Along these lines, while the interface of the present invention is specifically designed and adapted to be utilized with electronic componentry that already is electrically isolated, such added electrical insulation, as provided by the substrate 18, additionally ensures such electrical isolation, which as those skilled in the art will recognize is frequently required in such applications.

To further facilitate and enhance the thermal performance of the thermal interface 10 of the present invention, there is preferably provided a second layer 20 of a thermally conductive compound formed upon the outwardly facing surface of substrate 18. As with first layer 16, second layer 20 is preferably formulated to have certain desired phase-change properties, namely, assumes a solid phase when the electronic component is not operating, but liquifies when subjected to the operating temperature of the electronic component, so as to ensure that any voids or gaps formed by surface irregularities present upon the surface of the heat sink become filled, thereby maintaining a generally continuous mechanical contact to thus facilitate the transfer of heat to the heat sink coupled therewith.

As will be recognized by those skilled in the art, the interface 10 of the present invention, because of its novel construction, will only be fabricated from three layers of material, namely, the first layer of thermal compound 16, intermediate substrate 18 and second layer of thermal compound 20, perspectively illustrated in FIG. 3. Such construction, due to the minimal amount of layers utilized, is specifically configured for optimal heat transmission therethrough, and thus is ideally suited for application as a thermal interface for facilitating heat transfer from an electronic component to a heat sink. As those skilled in the art will appreciate, by eliminating additional layers of material, which are typically present in prior art interfaces, there is thus facilitated the performance of heat transfer from the electronic component to a heat sink. More specifically, it is well-known that the rate of heat transfer through such interface is reduced by each layer added thereto.

In contrast, as depicted in FIG. 4, there is shown a prior art interface 26 having a seven-layer construction. The layers comprising the prior art interface 26 comprise, from bottom to top, a first or external thermal compound layer 28, a first non-conductive substrate 30, a first or internal adhesive layer 32, a layer of conductive material 34, a second internal adhesive layer 36, a second non-conductive substrate 38, and a second external thermal compound layer 40. As discussed above, such multi-layer construction substantially reduces the rate of heat transfer therethrough, with the addition of each additional layer providing that much more of an impediment in achieving the desired thermal conductivity. Additionally, by using fewer layers, the thermal interface 10 of the present invention is provided with a reduced thickness than such prior art interfaces, which, as a result, even further enhances the flow of heat therethrough.

Referring now to FIGS. 5 and 6, and initially to FIG. 5, there is shown an improved heat sink 50 constructed in accordance to a preferred embodiment of the present invention. As shown, the heat sink 50 comprises the combination of a baseplate 52 and a folded-fin assembly 60, the latter being compressively mounted upon an electrically insulated platform surface 52a formed on the baseplate 52 (shown in FIG. 6), via a pair of pressure clips 68a, 68b and electrically insulated pressure spreaders 64a, 64b. In order to provide the desired electrical insulation, the platform surface 52a may have formed thereon a sheet of electrically insulated material, such as KAPTON-type MT. Similarly, the pressure clips 68a, 68b will preferably be formed from electrically nonconductive materials such as fiberglass, or other like materials.

The baseplate 52 is provided with a plurality of apertures 54 to enable the same to be fastened, via bolts and the like, to a given heat-dissipating component (not shown). The baseplate 52 further has formed thereon opposed pairs of slots 56a, a' and 56b, b' that are designed and configured to receive respective ones of pairs of feet 70a, a' and 70b, b' formed upon pressure clips 68a, 68b, more clearly seen in FIG. 6. As will be appreciated by those skilled in the art, slots 56a, a' and 56b, b' provide points of leverage by which pressure clips 68 can impart a downwardly compressive force, via pressure spreader 64a, 64b, upon the folded-fin assembly 60, and more particularly the upper folds 60b thereof. The baseplate 52 is preferably formed from a material having excellent thermally conductive properties, such as aluminum and other like metals.

The folded-fin assembly 60 preferably comprises a unitary piece of corrugated metal, such as aluminum or other like materials well-known to those skilled in the art, that have ideal heat-dissipating properties. As illustrated, the folded-fin assembly 60 is formed to have a generally serpentine configuration such that the same is provided with a plurality of downwardly facing bends 60a that are oriented to mate with the electrically insulated upper platform surface 52a of baseplate 52, more clearly seen in FIG. 6, and a plurality of upwardly oriented folds 60b, the latter being forced compressively downward via pressure clips 68a, 68b, and pressure spreader 64a, 64b.

As will be recognized by those skilled in the art, by using a folded-fin assembly 60, the heat sink 50 is thus provided with a heat-dissipating component that is not limited by prior art extrusion processes. As is well-known, prior heat sinks formed from extruded aluminum possess substantial limitations insofar as most extrusion processes limit the height of such fins formed thereon to dissipate heat, as well as the spacing therebetween. Such limitations do not apply to the folded-fin assembly 60, in contrast, by virtue of having fins folded into such corrugated sections 60a, 60b.

To maximize and facilitate physical contact, and thus enhance thermal conductivity between the folded-fin assembly 60 and baseplate 52, there are provided pressure clips 68a, 68b and pressure spreaders 64a, 64b that cooperate to impart a downwardly compressive force upon the outwardly extending bends 60b of the folded-fin assembly 60 thus forcing the folded-fin assembly to remain firmly seated and compressed against the baseplate 52. In the preferred embodiment shown, each pressure clip 68a, 68b is provided with downwardly extending legs 72a, a' and 72b, b' having outwardly extending feet 70a, a' and 70b, b' formed at the distalmost ends thereof. The legs 72 are connected to one another via an elongate segment defined by downwardly-biased sections 74 and mid-portion 76. As will be readily appreciated by those skilled in the art, when the feet 70 of each respective pressure clip 68a, 68b are received within those dedicated slots 56 formed upon baseplate 52, such downwardly biased sections 74 and mid-portion 76 are caused to impart the aforementioned downwardly compressive force.

Pressure spreaders 64a, 64b, which are preferably electrically insulated, are provided to impart a more even distribution of force about the upwardly extending bend 60b of folded-fin assembly 60. As shown, the pressure spreaders 64a, 64b preferably comprise elongate beams that are designed and configured to align with downwardly-biased sections 74 and mid-portion 76 of each respective pressure clip and become sandwiched between the clip 68 and the top fold 60b of folded-fin assembly 60. Advantageously, by compressively bonding the folded-fin assembly 60 against baseplate 52, thermal conductivity and, ultimately, heat dissipation is maximized and allows for greater heat transfer than prior art heat sinks.

To further facilitate the transfer of heat, there is optionally provided upon the upper platform surface 52a of baseplate 52 a layer of thermally conductive compound formulated to have the aforementioned desired phase-change properties to thus ensure maximum mechanical contact between the folded-fin assembly 60 and baseplate 52. Alternatively, to the extent desired, an interface pad or other like system may be positioned upon the platform surface 52a to provide further desired properties (e.g., electrical insulation) in addition to facilitating the transfer of heat.

In yet another optional embodiment of the present invention, base plate 52 maybe provided with a ground contact connection 78, shown in phantom in FIGS. 5 and 6, to thus enable an electronic utilized therewith to become electrically grounded. Along these lines, while most electronic componentry typically in use is constructed and/or packaged to be electrically isolated, to the extent such componentry is not grounded, ground contact connection 58 will thus facilitate that end. It will be readily recognized by those skilled in the art, however, that in such applications, base plate 52 will be for the heat sink 50 will further include an electrically insulated pad or layer, such as 80 depicted in phantom in FIGS. 5 and 6, to ensure electrical isolation of the base plate 52. In this respect, it is contemplated that such optional pad or layer 80 may take the form of an interface pad or other like system that, in addition to providing electrical insulation, can further facilitate the transfer of heat.

Although the invention has been described herein with specific reference to a presently preferred embodiment thereof, it will be appreciated by those skilled in the art that various additions, modifications, deletions and alterations may be made to such preferred embodiment without departing from the spirit and scope of the invention. For example, with respect to the improved heat sink of the present invention, any of a variety of mechanisms may be utilized to impart the compressive force against the folded-fin assembly whereby the latter is caused to be compressively bonded to the baseplate coupled therewith. Additionally, upper platform surface 52a need not necessarily be formed to be electrically insulated, but may simply comprise an outwardly facing surface of the baseplate 52. Accordingly, it is intended that all reasonably foreseeable additions, modifications, deletions and alterations be included within the scope of the invention as defined in the following claims.

What is claimed is:

1. A thermal interface for facilitating heat transfer from an electronic component to a heat sink and suppressing electromagnetic interference from said heat sink comprising:
   a) a solid, generally planar single layer polyimide substrate, said substrate having first and second surfaces; and
   b) at least one layer of conformable, heat conducting paraffin-based material formed upon each of the first and second surfaces of said substrate, said heat conducting material being formulated to enhance the heat transfer from said electronic component to said heat sink.

2. The thermal interface of claim 1 wherein each said layer of conformable, heat conducting material is formulated to have selective phase-change properties such that said material exists in a solid phase at normal room temperature, but melts when subjected to temperatures of approximately 51° C. or higher.

3. The thermal interface of claim 1 wherein said conformable, heat conducting material comprises:
   a) 60% to 90% by weight of paraffin;
   b) 10% to 40% by weight of graphite; and
   c) up to 5% by weight of an ethylene vinyl acetate polymer.

4. A heat sink for dissipating heat transferred thereto by an electric component comprising:
   a) a baseplate mounted to said electronic component, said baseplate having a platform surface; and
   b) a folded-fin assembly mounted upon said platform surface of said baseplate; and
   c) a thermal interface disposed upon said platform surface, said interface being comprised of a heat conductive substrate having a high dielectric capability.

5. The heat sink of claim 4 further comprising:
   a) a layer of thermally conductive material formed upon said platform surface of said baseplate intermediate said folded-fin assembly, said heat conducting material being formulated to facilitate the transfer of heat from said baseplate to said folded-fin assembly.

6. The heat sink of claim 4 further comprising:
   a) a compression apparatus attached to said baseplate for imparting a downwardly compressive force against said folded-fin assembly such that said folded-fin assembly is caused to be compressively bonded to said baseplate.

7. The heat sink of claim 6 wherein said compression apparatus comprises:
   a) an elongate pressure clip attached to said baseplate, said pressure clip being configured to extend over said folded-fin assembly when said folded-fin assembly is mounted upon said platform surface and impart a downwardly compressive force thereto to cause said folded-fin assembly to become compressively bonded with said baseplate; and
   b) an electrically isolated pressure spreader positioned intermediate said pressure clip and said folded-fin assembly, for evenly distributing the downwardly compressive force imparted by said pressure clip upon said folded-fin assembly.

8. The heat sink of claim 7 wherein said pressure clip comprises an elongate member having opposed ends and a downwardly extending leg and foot formed upon each respective opposed end, said pressure clip further including an elongate mid-portion extending over said folded-fin assembly for imparting a downwardly compressive force thereto, said baseplate further having formed thereon a pair of opposed slots receiving and interconnecting with a respective one of said feet of said pressure clip.

9. The heat sink of claim 6 wherein said compression apparatus comprises:
   a) a plurality of said elongate pressure clips attached to said baseplate; and
   b) a plurality of pressure spreaders, each respective pressure spreader being positioned intermediate a dedicated one of said plurality of pressure clips and said folded-fin assembly.

10. The heat sink of claim 4 wherein said heat conductive substrate comprises a polyimide.

11. The heat sink of claim 4 wherein said base plate is formed from an electrically conductive material, said base plate having formed thereon a ground contact connection.

12. The heat sink of claim 11 wherein said heat sink further comprises:
   a) a layer of thermally-conductive, electrically insulated material interposed between said base plate and said electronic component.

13. The heat sink of claim 12 wherein said layer of thermally-conductive, electrically insulated material comprises a thermal interface, said thermal interface comprising a generally planar, non-electrically conductive substrate having first and second surfaces and at least one layer of conformable heat conducting material formed upon said first and second surfaces, said heat conducting material being formulated to enhance the heat transfer from said electronic component to said heat sink.

14. The thermal interface of claim 1 wherein said conformable, heat conducting material comprises:
   a) 60% to 90% by weight of paraffin;
   b) 0% to 5% by weight of resin; and
   c) 10% to 40% by weight of an electrically-conductive filler.

* * * * *

UNITED STATES PATENT AND TRADEMARK OFFICE
CERTIFICATE OF CORRECTION

PATENT NO. : 6,483,707 B1 Page 1 of 1
DATED : November 19, 2002
INVENTOR(S) : Raymond G. Freuler et al.

It is certified that error appears in the above-identified patent and that said Letters Patent is hereby corrected as shown below:

<u>Title page,</u>
Item [73], change "Rock" to -- Rocky --

<u>Column 3,</u>
Line 39, change "tends" to -- tend --
Line 48, after "sinks" insert -- , --
Lines 48-49, after "sinks" delete -- has been the introduction of --
Line 49, after "sinks" insert -- have been introduced --

<u>Column 5,</u>
Line 30, after "features" insert -- of --

<u>Column 9,</u>
Line 36, change "maybe" to -- may be --

Signed and Sealed this

Twenty-fifth Day of February, 2003

JAMES E. ROGAN
*Director of the United States Patent and Trademark Office*